Feb. 24, 1959 J. T. WALLMARK 2,875,384

SEMICONDUCTOR DEVICES

Filed Dec. 6, 1956 2 Sheets-Sheet 1

INVENTOR.
JOHN T. WALLMARK
BY

ATTORNEY

INVENTOR.
JOHN T. WALLMARK
BY J. C. Whittaker
ATTORNEY

United States Patent Office 2,875,384
Patented Feb. 24, 1959

2,875,384

SEMICONDUCTOR DEVICES

John T. Wallmark, Princeton, N. J., assignor to Radio Corporation of America, a corporation of Delaware Application December 6, 1956, Serial No. 626,623

12 Claims. (Cl. 317—234)

This invention relates to improved semiconductor devices and more particularly to improved devices having stabilized electrical characteristics.

It is known that the operating characteristics of semiconductor devices that include a wafer of semiconductive material are strongly dependent on the nature and condition of the wafer surface. One of the important characteristics of the transistor type of semiconductor device is the current transfer ratio, symbolized as $\alpha_{cb}$ and defined as the collector-to-base short circuit current amplification factor. It is desirable for most applications of transistor type devices that the $\alpha_{cb}$ value be both high and stable. However, it has been found difficult to make semiconductor devices in which $\alpha_{cb}$ does not decrease on ageing. Many units of this type suffer a deterioration in $\alpha_{cb}$ value of as much as one third in the first ten hours after fabrication if stored at 70° C. At room temperature, the $\alpha_{cb}$ declines about 21% in 200 hours. The decrease in $\alpha_{cb}$ is believed to be caused by slow oxidation of the semiconductor surface, and is dependent on the temperature and the humidity of the place where the units are stored. Another parameter which is dependent on humidity is the breakdown voltage, which decreases sharply as the ambient humidity increases.

The performance of most semiconductor devices is also affected by the rate at which negative charge carriers (electrons) and positive charge carriers (electron-deficiency centers known as holes) recombine at the surface of the semiconductor material used. This rate is known as the surface recombination velocity. In most semiconductor devices, the surface recombination velocity is variable, thus resulting in undesired variations in performance. However, it has been found difficult to produce semiconductor devices in which the surface recombination velocity is stable, particularly if stabilization is desired at a low level.

It is therefore an object of this invention to provide improved semiconductor devices.

Another object is to provide improved semiconductor devices having improved stabilized surface characteristics.

Still another object is to provide improved semiconductor devices which may be stored at relatively high temperatures without deterioration.

Yet another object is to provide improved semiconductor devices which may be stored and may be operated at relatively high humidities without excessive deterioration.

But another object is to provide improved semiconductor devices which have improved long term electrical stability.

A further object is to provide improved semiconductor devices having a low stable surface recombination velocity.

These and other objects are accomplished by the instant invention which provides improved methods of stabilizing the electrical parameters of monoatomic semiconductor surfaces and the improved devices resulting from use of these methods. Since it is practically impossible to prevent oxidation of the semiconductor surface, the method of this invention is to preoxidize the surface to such an extent that whatever oxidation takes place subsequently will have a negligible influence on the surface stability. In particular, it has now been found that the surface characteristics and stability of semiconductive wafers can be greatly improved by forming an adherent coating of the semiconductor monoxide over the wafer surface, then protecting the monoxide layer by covering it with a thin film of he semiconductor dioxide.

The invention and its features will be described in greater detail with reference to the accompanying drawing, in which Figure 1 is a flow chart outlining the steps of the process according to a preferred embodiment of the invention.

Figure 1:
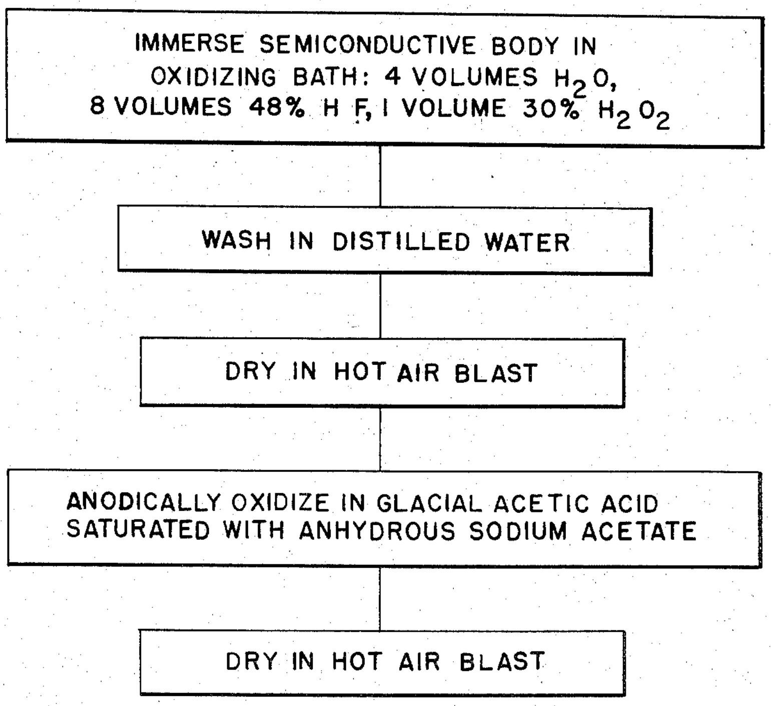

A circuit element which includes a semiconductive wafer may be treated according to a preferred embodiment of the invention, as shown by the flow chart of Figure 1, to provide a device with improved electrical characteristics. The invention is particularly applicable to monoatomic semiconductors, that is, to semiconductive materials consisting of a single atomic species, such as wafers made of monocrystalline germanium or silicon, or to alloys of germanium and silicon. Stabilization of $\alpha_{cb}$ may be obtained by the method of the invention with wafers of P-conductivity type as well as N-conductivity type or intrinsic wafers. Stabilization of surface recombination velocity may also be obtained with N-conductivity type or P-conductivity type or intrinsic wafers. However, if stabilization of $\alpha_{cb}$ at high values and $s$ at low values is desired, the invention is best applied to N-conductivity type wafers. For P-type wafers, a relatively thick layer of the dioxide alone will give good results.

As an example, the treatment will be described with reference to one of the widely used types of semiconductor devices, the triode transistor made by surface alloying two indium dots upon opposing major surfaces of an N-conductivity type germanium wafer. The preparation of such a device is described by Law, Mueller, Pankove, and Armstrong in "A Developmental Germanium P–N–P Junction Transistor," Proceedings of the IRE, volume 40, No. 11, pp. 1352–1357. See also "Uniform Planar Alloy Junction for Germanium Transistor," by C. W. Mueller and N. H. Ditrick, RCA Review, March 1956. For convenience in handling, the instant invention is utilized after the units have had leads attached and have been mounted on an insulating stem in readiness for encapsulation.

The unit is first immersed in an oxidizing bath for about 5 to 60 seconds, depending on the thickness of the monoxide layer desired. The bath may be prepared by mixing 8 volumes of concentrated hydrofluoric acid (48 percent HF) with 4 volumes of distilled water and one volume of concentrated hydrogen peroxide (30 percent $H_2O_2$). These proportions of the reagents are not critical. The concentration of hydrogen peroxide in the bath may be reduced to one-tenth of the stated amount if desired, and the unit immersed for a longer period of time. However, if the hydrogen peroxide concentration is increased too much, the results are unsatisfactory. The solution described is preferred because it gives good results and works rapidly. During this step the germanium wafer is oxidized at the surface to germanium monoxide, which is practically insoluble in the solution used.

Thereafter, the unit is withdrawn from the oxidizing bath, washed in distilled water, and dried in a hot air blast. After the unit has been washed and dried, interference colors may be seen on the wafer surface. The structure of the surface after this treatment consists of an adherent continuous film of germanium monoxide approximately 100 to 10,000 angstrom units thick deposited directly over the bulk of the germanium. Measurement of $\alpha_{cb}$ in a group of germanium dried transistors before and after the formation of the monoxide layer indicate that on the average $\alpha_{cb}$ is increased from 5 to 10 percent. However, the monoxide layer is not stable. It is believed that in air or an oxygen-containing ambient, the outermost portion of the monoxide layer is further oxidized to germanium dioxide.

The next step is to immerse the washed and dried unit in an electrolytic bath composed of glacial acetic acid containing a few percent of dissolved anhydrous sodium acetate. The exact amount of sodium acetate is not critical as its function is to make the bath more conductive. The cathode may be a thin sheet of platinum, which is not attacked by the reagents used. The unit is made the anode and a current of about 60 microamps. is passed through each unit for about 30 minutes. Anodic oxidation thereby forms a continuous film of germanium dioxide over the layer of germanium monoxide. The dioxide film thus formed is estimated to be about 10 to 10,000 angstrom units thick, depending on the amount of current and the period of time in the bath. Although the dioxide film is comparatively thin, it is an effective barrier against the oxygen and water vapor of the atmosphere. Further changes in the chemical state of the germanium surface are thus prevented or become extremely slow. After this step the units are heat treated and thereby $\alpha_{cb}$ is reduced. When units are kept at 110° C. for 5 minutes or longer, $\alpha_{cb}$ decreases about 18 percent on the average. Since the $\alpha_{cb}$ value was previously increased from 5 to 10 percent by the first step of the method, there is an average decline of about 10 percent in $\alpha_{cb}$. However, $\alpha_{cb}$ is stabilized by this method. This may be seen by an examination of the curves in Figure 2, which show the variation of $\alpha_{cb}$ with time for groups of treated and untreated transistors. The curve for the treated transistor represents an average of 5 units, while the curves of the untreated units are an average of 3 units for each curve. The value of $\alpha_{cb}$ for the treated units is remarkably stable even when kept at 110° C. The untreated units decline rapidly, even for the groups kept at temperatures below 110° C.

An alternative method of forming the dioxide film is to store the unit for one hour in air at 110° C. The oxygen of the air will react with the monoxide layer and form a film of germanium dioxide which grows in thickness by a phase boundary type of reaction. This reaction however, cannot proceed beyond the initial stage because diffusion of vacancies (germanium or oxygen) through the dioxide layer is extremely slow. Anodic oxidation of the monoxide layer is thus preferred because it is more rapid and susceptible to more precise control than oxidation in air.

After the anodic oxidation step, the unit is treated in a blast of hot air. Washing in water should be omitted because the germanium dioxide film is water soluble. The unit may then be cased by conventional methods.

A transistor prepared without the monoxide layer and only a film of the dioxide on the wafer surface would have $\alpha_{cb}$ stable, but at a very low value. In most applications, it is desired that $\alpha_{cb}$ should be stabilized at a high value. By first depositing a layer of monoxide, $\alpha_{cb}$ is kept high, but it is not stable until it is covered by the protective film of the dioxide. In some cases, such as large signal applications, it may be desirable to stabilize $\alpha_{cb}$ at intermediate values. This can be accomplished by utilizing the method of this invention to form a structure with a relatively thin layer of germanium monoxide over the bulk of the wafer, and a relatively thick film of germanium dioxide over the monoxide layer. The thickness of the monoxide layer can be decreased by decreasing the concentration of the hydrogen peroxide in the oxidizing bath or the time of immersion in the bath. The thickness of the dioxide layer can be increased by increasing the period of anodic oxidation, or increasing the amount of current.

An important feature of this invention is that it enables a return to the technique of potting semiconductor devices in synthetic resin or plastic. Potting was at first widely adopted by the industry not only because it was an inexpensive and rapid method of encapsulating semiconductor devices, but also because it fixed the parts of each unit in place, so that vibrations and accelerations did not affect the alignment of unit components. However, it was found that moisture penetrated the plastic and caused such marked deterioration of the units during storage that most of the industry abandoned plastic potting for slower and more expensive alternatives, such as mounting each unit in a metal case in a controlled ambient, or in a vacuum. It has been found that units treated by the method of this invention are relatively insensitive to moisture. Such treated units have been potted in conventional synthetic resins or thermo-setting plastics known to the art, such as Araldite, and the decline of $\alpha_{cb}$ has been measured. The variation of $\alpha_{cb}$ with time at room temperatures and 100% humidity for units so treated is illustrated in the graph shown in Figure 3. The curve is an average of three units. For comparison, there is shown the curves for untreated units potted in Araldite and stored in ambient atmospheres of 100 percent relative humidity at room temperatures. Treated units have a higher value of $\alpha_{cb}$ to begin with, and instead of exhibiting the usual $\alpha_{cb}$ decline, actually increase in value up to 5,000 hours. Untreated units potted in the same plastic exhibit a lower $\alpha_{cb}$ to begin with, and decline sharply after about 350 hours.

Figures 2, 3, 4, 5:
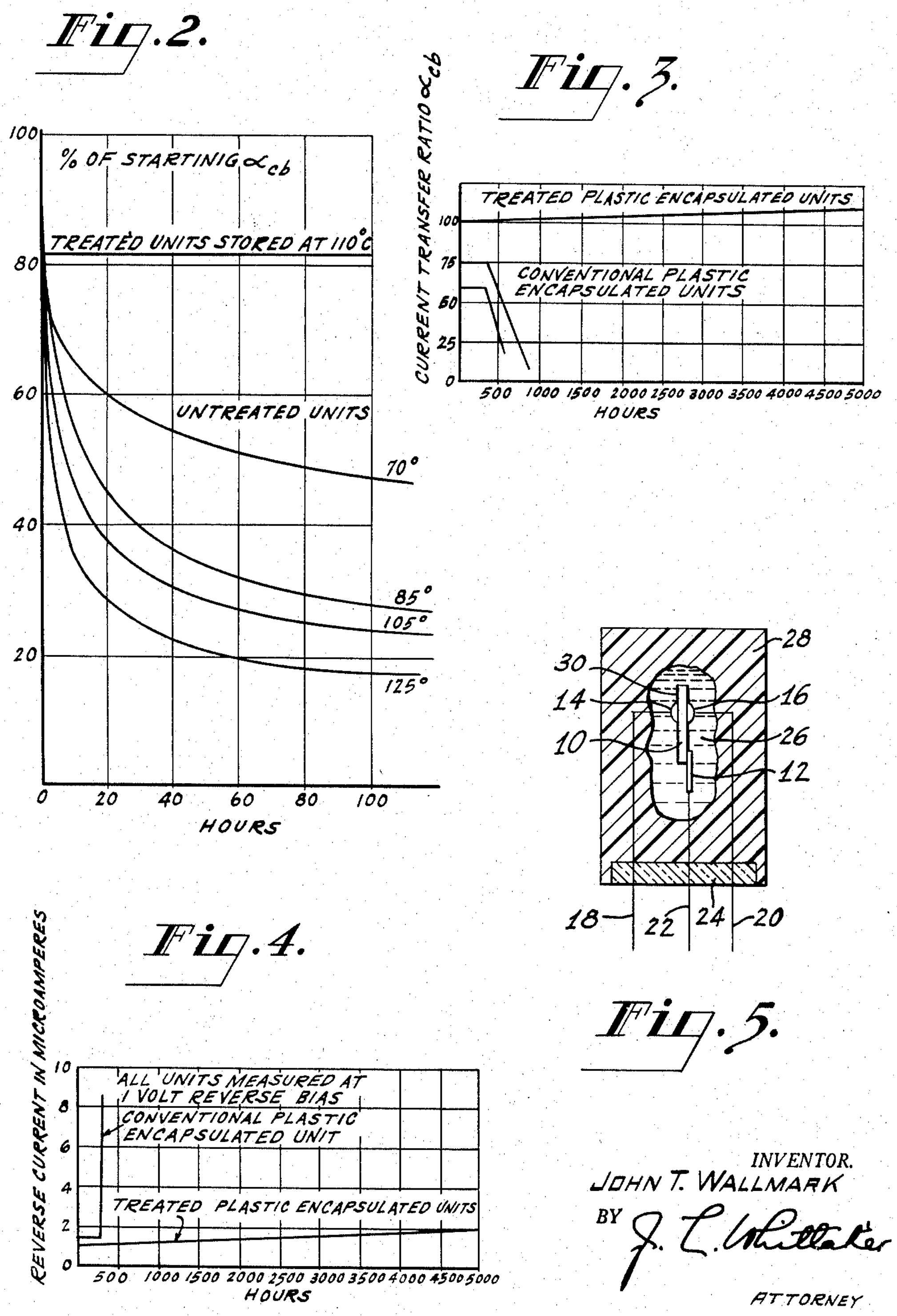
Figure 2 is a graph of the variation of $\alpha_{cb}$ with time for treated units kept at 110° C. For comparison, there is also shown the curves for untreated units maintained at various temperatures.
Figure 3 is a graph of the variation of $\alpha_{cb}$ with time for triode transistors treated by the method of this invention and then encapsulated in Araldite. For comparison, there is shown the curves for similar untreated units which have also been potted in Araldite.
Figure 4 is a graph of the variation with time of the collector-to-base reverse current in microamps at an applied reverse bias of one volt, for triode transistors of the type described, which have been treated by the method of this invention and then potted in Araldite. For comparison, there is shown the curve of similar untreated units encapsulated in the same plastic.
Figure 5 is a schematic diagram of one embodiment of this invention, a treated transistor encapsulated in a synthetic resin.

Figure 5 shows the construction of the transistors which were treated by the method of this invention, then potted in plastic and used to obtain the data graphed in Figures 2 to 4. The units are triodes of the surface alloyed P–N–P type described by Law, Mueller, Pankove and Armstrong, supra. See also pp. 34–35 of "Transistor Electronics," by Lo, Endres, Zawels, Waldhauer, and Cheng, Prentice-Hall, Englewood Cliffs, 1955. An N-conductivity type monocrystalline germanium wafer 10 mounted on a nickel base tab 12 bears on opposing major surfaces an indium emitter pellet 14 and an indium collector pellet 16 which have been alloyed to the wafer surfaces to form rectifying electrodes. Lead wires 18, 20, and 22 are connected to the emitter electrode 14, collector electrode 16, and base tab 12 respectively. The lead wires pass through an insulating stem 24, which may for example be glass. The unit is then handled by means of the stem 24, and is treated as described in Figure 1, thus forming over the exposed surface of the wafer 10 a protective coating 30 consisting of an adherent layer of germanium monoxide covered by a film of germanium dioxide. The wafer 10 is then dipped in a viscous lacquer, for example polystyrene, so that an irregular blob 26 of the lacquer surrounds the wafer and the adjacent portions of the leads. The lacquer blob 26 prevents undesirable direct contact of the potting material with the wafer 10. The unit is then encapsulated by inserting the wafer 10 and stem 24 in a mold (not shown), which is filled with a liquid synthetic resin or plastic such as methyl methacrylate or Araldite. The synthetic resin solidifies and forms a protective sheath 28.

Units treated by the method of this invention are also improved with respect to reverse current. As shown by Figure 4, transistors treated by the invention and encapsulated in plastic show only a very slight increase in the reverse current. At 5,000 hours, the average reverse current of three units at a bias of one volt increased from one microamp. to only 1.8 microamps. In contrast, untreated units similarly encapsulated increased sharply from 1.4 microamps. at 300 hours to 10 microamps. at 400 hours.

Another important feature of this invention is that it provides a method for the control of the surface recombination velocity, symbolized as $s$. An increase in $s$ from approximately 200 cm./sec. to approximately 600 cm./sec. causes an $\alpha_{cb}$ drop of approximately 20 percent of the original value. In some applications, for example large signal devices, a comparatively high value of $s$ is desirable since it reduces $\alpha_{cb}$ at low currents more than at high currents, and therefore reduces the overall variation of $\alpha_{cb}$ with current. For a complete discussion, see W. M. Webster, "On the Variation of Junction Transistor Current-Amplification Factor With Emitter Current," Proceedings IRE 42, 1954, p. 914. Devices with relatively large $s$ can be fabricated by applying a relatively thin layer of monoxide over the germanium wafer, and depositing over the monoxide a relatively thick film of germanium dioxide by prolonged anodic oxidation, as explained above. The instant invention provides improved $\alpha_{cb}$ and $s$ stability for all types of semiconductive devices which include a base of germanium or silicon, and is not limited to the triode transistor described above by way of example. Alloy type diodes, tetrodes, grown junction devices, drift transistors, unipolar transistors, and semiconductive photoelectric devices may be treated according to the invention to improve their electrical characteristics.

There have thus been described improved semiconductive devices and improved methods of treating materials and devices to improve the surface characteristics of the materials and the electrical properties of the devices.

What is claimed is:

1. A method of treating a body composed of at least one monoatomic semiconductor to stabilize the chemical and electrical characteristics of the surface thereof, comprising the steps of first treating said body to form a layer composed of a monoxide of said semiconductor on said surface, then treating said body to form a layer composed of a dioxide of said semiconductor over said monoxide layer.

2. A method of treating a monoatomic semiconductive body to stabilize the chemical and electrical characteristics of the surface thereof, comprising the steps of forming a layer composed of a monoxide of said monoatomic semiconductive body on said surface by immersing said body in an oxidizing bath, then withdrawing said body and forming a dioxide layer composed of a dioxide of said semiconductive body on said monoxide layer.

3. A method of treating a semiconductive monocrystalline germanium body to stabilize the chemical and electrical characteristics of the surface thereof, comprising the steps of forming a germanium monoxide layer on said surface by immersing said body in a solution composed of 8 volumes concentrated hydrofluoric acid, 1 volume concentrated hydrogen peroxide and 4 volumes water, withdrawing said body from said solution, immersing said body in an electrolytic bath composed of anhydrous sodium acetate and glacial acetic acid, and forming a germanium dioxide layer on said monoxide layer by making said body the anode of said bath and passing a current therethrough.

4. A semiconductor device comprising a wafer composed of a monoatomic semiconductor having a stabilizing adherent coating over the surface thereof, said coating being composed of the monoxide of said semiconductor, and a protective film over said monoxide coating, said film being composed of the dioxide of said semiconductor.

5. A semiconductor device comprising an N-conductivity type germanium wafer having a stabilizing adherent coating of germanium monoxide over the surface thereof, and a protective film of germanium dioxide over said monoxide coating.

6. A semiconductor device comprising a wafer composed of a monoatomic semiconductor, a rectifying electrode in contact with said wafer, and adherent stabilizing coating over the surface of said wafer, said coating being composed of the monoxide of said semiconductor, and a protective film over said monoxide coating composed of the dioxide of said semiconductor.

7. A semiconductor device comprising a wafer composed of a monoatomic semiconductor, a rectifying electrode in contact with said wafer, an adherent stabilizing coating over the surface of said wafer, said coating being composed of the monoxide of said semiconductor, a protective film over said monoxide coating composed of the dioxide of said semiconductor, a sheath of solidified synthetic resin around said wafer, and leads ohmically connected to said electrode and said wafer, said leads projecting through said synthetic resin sheath.

8. A semiconductor device comprising a wafer of N-type germanium having an electrode in rectifying contact with said wafer, an adherent stabilizing coating of germanium monoxide over the surface of said wafer, and a protective film over said monoxide coating composed of garmanium dioxide.

9. A semiconductive photo-electric device comprising a P-type germanium body, an electrode in rectifying contact with said body, a stabilizing coating of germanium monoxide disposed over the surface of said body, and a protective film of germanium dioxide over said coating.

10. A semiconductor device comprising a monoatomic monocrystalline semiconductive wafer having two rectifying electrodes and an ohmic electrode in contact with said wafer, an adherent stabilizing coating over the surface of said wafer, said coating being composed of the monoxide of said semiconductor, and a protective film over said monoxide coating composed of the dioxide of said semiconductor.

11. A semiconductor device comprising a monoatomic semiconductive wafer, electrodes in contact with said wafer, an adherent stabilizing layer composed of the semiconductor monoxide over the surface of said wafer, a protective film over said monoxide layer composed of the dioxide of said semiconductor, a sheath of solidified synthetic resin completely surrounding said wafer and electrodes, and leads ohmically connected to said electrodes, said leads projecting outward through said synthetic resin sheath.

12. A semiconductor device comprising a monocrystalline N-conductivity type germanium wafer having two rectifying electrodes and an ohmic electrode in contact with said wafer, an adherent stabilizing coating of germanium monoxide over the surface of said wafer, and a protective film of germanium dioxide over said monoxide coating.

References Cited in the file of this patent

UNITED STATES PATENTS

| | | |
|---|---|---|
| 1,748,012 | Dooley | Feb. 18, 1930 |
| 2,711,496 | Ruben | June 21, 1955 |